(12) United States Patent
Liao et al.

(10) Patent No.: US 12,227,637 B2
(45) Date of Patent: Feb. 18, 2025

(54) BENZOXAZINE RESIN, COMPOSITION THEREOF AND COPPER CLAD LAMINATE MADE THEREOF

(71) Applicant: A.C.R. TECH CO., LTD., Taipei (TW)

(72) Inventors: Shih-Hao Liao, Taipei (TW); Min-Yuan Yang, Taipei (TW); Ya-Yen Chou, Taipei (TW); Jheng-Hong Ciou, Taipei (TW); Cheng-Chung Chen, Taipei (TW)

(73) Assignee: A.C.R. TECH CO., LTD., Taipei (TW)

( * ) Notice: Subject to any disclaimer, the term of this patent is extended or adjusted under 35 U.S.C. 154(b) by 276 days.

(21) Appl. No.: 18/075,775

(22) Filed: Dec. 6, 2022

(65) Prior Publication Data

US 2023/0193016 A1    Jun. 22, 2023

(30) Foreign Application Priority Data

Dec. 16, 2021   (TW) .................. 110147224

(51) Int. Cl.
*C08L 47/00* (2006.01)
*H05K 1/03* (2006.01)

(52) U.S. Cl.
CPC ............ *C08L 47/00* (2013.01); *H05K 1/0373* (2013.01)

(58) Field of Classification Search
None
See application file for complete search history.

(56) References Cited

FOREIGN PATENT DOCUMENTS

TW    I752357 B    1/2022

*Primary Examiner* — John Vincent Lawler
(74) *Attorney, Agent, or Firm* — Muncy, Geissler, Olds & Lowe, P.C.

(57) ABSTRACT

A benzoxazine resin, including a compound of the following Formula 1-1:

(Formula 1-1)

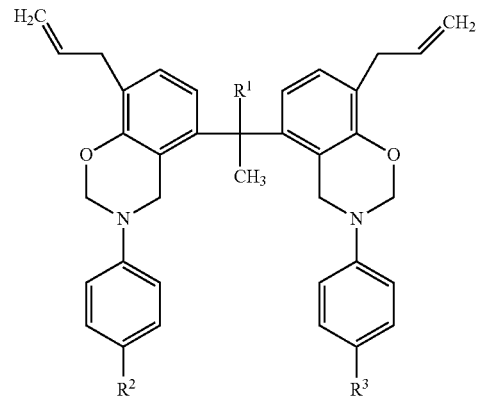

where $R^1$, $R^2$, and $R^3$ are as defined herein.

3 Claims, No Drawings

BENZOXAZINE RESIN, COMPOSITION THEREOF AND COPPER CLAD LAMINATE MADE THEREOF

FIELD OF THE INVENTION

The present invention relates to a benzoxazine resin, and in particular to a benzoxazine resin suitable for electronic components.

BACKGROUND OF THE INVENTION

Benzoxazine is a kind of nitrogen-bearing thermosetting resin having a structure similar to phenolic resin, and is a kind of six-membered heterocyclic compound system composed of O atoms and N atoms. Benzoxazine is generally a compound made from a phenolic compound, primary amine and a formaldehyde compound via Mannich reaction such that ring-opening polymerization is performed to generate a net structure similar to phenolic resin under the action of heating or a catalyst.

Benzoxazine resin has many advantages such as, low volume shrinkage (free of small-molecule by-products during the polymerization), low moisture absorption, excellent heat resistance, mechanical properties, electrical properties, and fire resistance. Therefore, the benzoxazine resin has been widely applied in the fields of matrix resin of composite materials, solvent-free immersion paint, electronic packaging material, flame retardant material, electrical insulating material and the like. Benzoxazine resin is the important material to produce copper clad laminates (CCL).

Benzoxazine resins known in the art can be referring to a China (Taiwan) invention patent application No. 108135737 proposed by the applicant of this case. This case discloses a benzoxazine resin of Formula 2, as shown below:

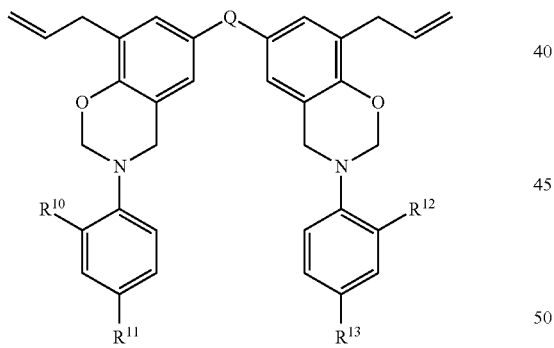

Q is —C(CH$_3$)$_2$—, and the corresponding $R^{10}$, $R^{11}$, $R^{12}$ and $R^{13}$ are hydrogen atoms. The copper clad laminate plate produced by the benzoxazine resin disclosed in this case with polyphenylene oxide resin (PPO/PPE), bismaleimide resin (BMI) and other additives has fair dielectric loss, but the bonding strength is still not high enough, which is against the subsequent preparation into a copper clad laminate and a circuit board. Therefore, there is still a room for improvement.

SUMMARY OF THE INVENTION

The major objective of the present invention is to solve the problem that the mechanical properties of the existing benzoxazine resins are to be improved.

To achieve the above objective, the present invention provides a benzoxazine resin, including a compound of the following Formula 1-1:

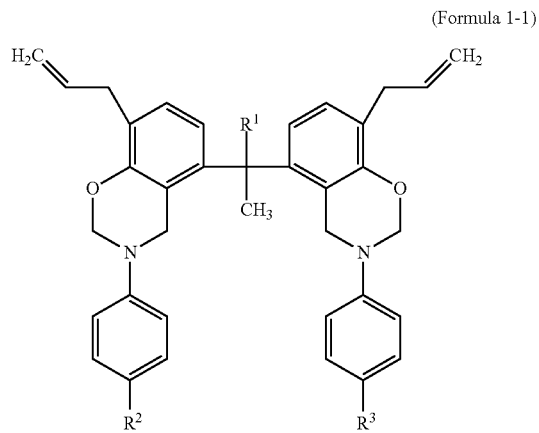

(Formula 1-1)

wherein $R^1$ is selected from a group consisting of:

(Formula 1-2)

(Formula 1-3)

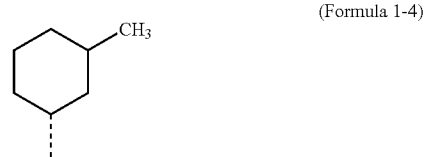

(Formula 1-4)

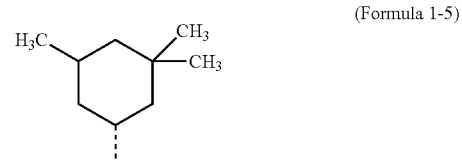

(Formula 1-5)

(Formula 1-6)

wherein the dashed line represents bonding; and $R^2$ and $R^3$ may be the same or different, and are each independently selected from a group consisting of H, halogen, an ether group, a thioether group, sulfonyl, sulfinyl, carbonyl, siloxy, substituted or unsubstituted C1-C10 alkyl, substituted or unsubstituted C1-C10 cycloalkyl and substituted or unsubstituted C6-C20 aryl.

Based on the characteristics of molecular design, a larger or three-dimensional side chain group ($R^1$ in particular) is used in the present invention. Compared with the benzoxazine resins known in the art, the present invention has larger steric hindrance and enhanced solubility, and can reduce the coefficient of thermal expansion, improve heat resistance and mechanical properties.

DETAILED DESCRIPTION OF THE PREFERRED EMBODIMENTS

The present invention discloses a benzoxazine resin having a structure of the following Formula 1-1:

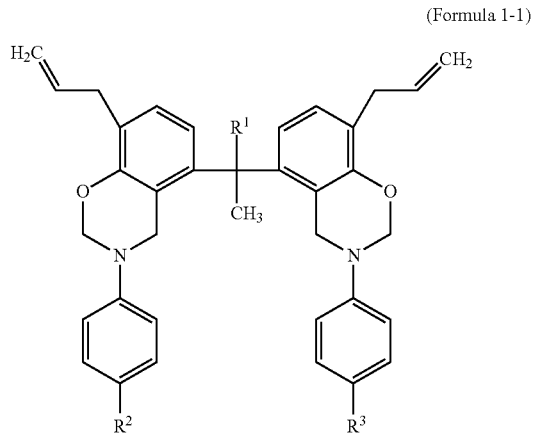

(Formula 1-1)

wherein $R^1$ is selected from a group consisting of:

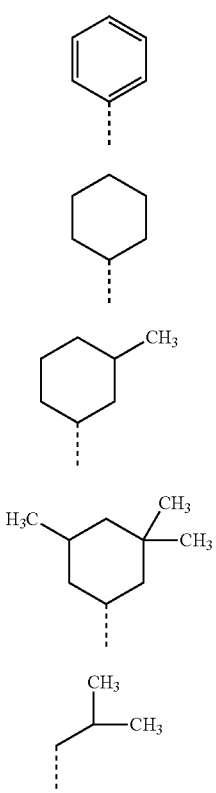

(Formula 1-2)

(Formula 1-3)

(Formula 1-4)

(Formula 1-5)

(Formula 1-6)

wherein the dashed lines in Formulas 1-2 to 1-6 represent bonding positions; and $R^2$ and $R^3$ may be the same or different, and are each independently H, halogen, an ether group, a thioether group, sulfonyl, sulfinyl, carbonyl, siloxy, substituted or unsubstituted C1-C10 alkyl, substituted or unsubstituted C1-C10 cycloalkyl or substituted or unsubstituted C6-C20 aryl.

In an example, the material for synthesizing the benzoxazine resin having a structure of Formula 1-1 mainly includes diphenol, monoamine and aldehydes. The synthetic method of the resin disclosed above will be described below, but the present invention is not limited to the following methods and steps.

SYNTHESIS EXAMPLE 1-1

435 g of 4,4'-(1-phenylethylidene)bisphenol (BisP-AP), 228 g of chloropropene and 300 g of propylene glycol monomethyl ether were added to a 3 L separable four-necked reaction flask to obtain a solution; the solution was warmed up to about 70° C. and stirred evenly while 160 g of sodium hydroxide solution (containing 50 wt. % sodium hydroxide) was added dropwise thereto within 120 min; and the solution was maintained at 70° C. and subjected to reaction for 30 min. After the reaction was completed, the solution was heated and subjected to reduced pressure (heated up to 120° C. and reduced pressure to 600 mmHg) to recover propylene glycol monomethyl ether. After the pressure was removed, 1500 g of methylbenzene was added and stirred evenly, then 600 g of water was added and stirred evenly to wash out NaCl and un-reacted reactants. After the solution was subjected to standing and layered, aqueous phase was removed, and the obtained product was washed with water for 3 times, then heated to recover methylbenzene, thus obtaining about 550 g of the following reactant. The reaction formula is as follows.

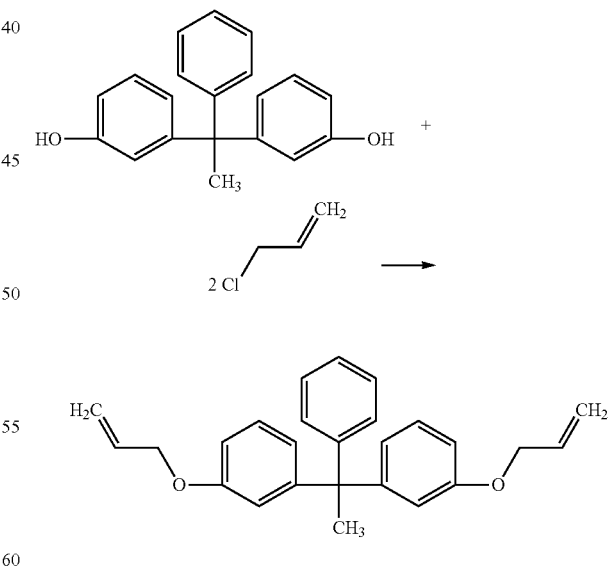

Next, 550 g of the above product and 50 g of propylene glycol monomethyl ether were added to a 1 L four-necked reaction tank provided with a heating unit, a thermometer and a blender, and heated up to 200° C., and reacted for 2 h, thus obtaining the following reactant. The reaction formula is as follows.

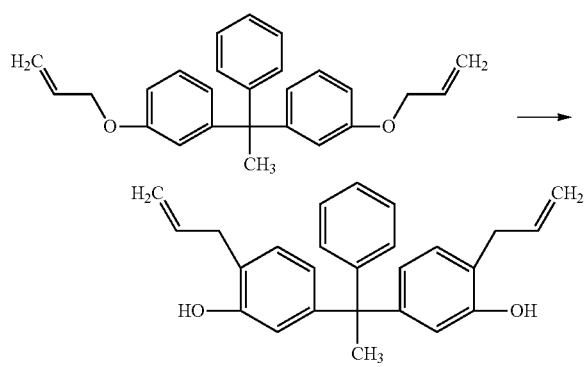

370 g of the above product (o-diallyl bisphenol-AP), 186 g of aniline and 400 g of methylbenzene were added to a 3 L separable four-necked reaction flask to obtain a solution; the solution was warmed up to about 40° C. and stirred evenly. 273 g of formaldehyde solution (containing 44 wt. % formaldehyde) was added dropwise to the solution within 20 min during the stirring process; the solution was heated and maintained at 85° C.-90° C. and reacted for 3 h; at the end of the reaction, heating was stopped, then the solution was subjected to standing for 20 min; after the solution was divided into two layers, the upper layer of aqueous phase and emulsion traces were removed. The solution was heated and subjected to reduced pressure treatment (heated up to 90° C. and reduced pressure to 90 mmHg) to recover the solvent to obtain 600 g of nitrogen-oxygen heterocyclic compound. The reaction formula is as follows.

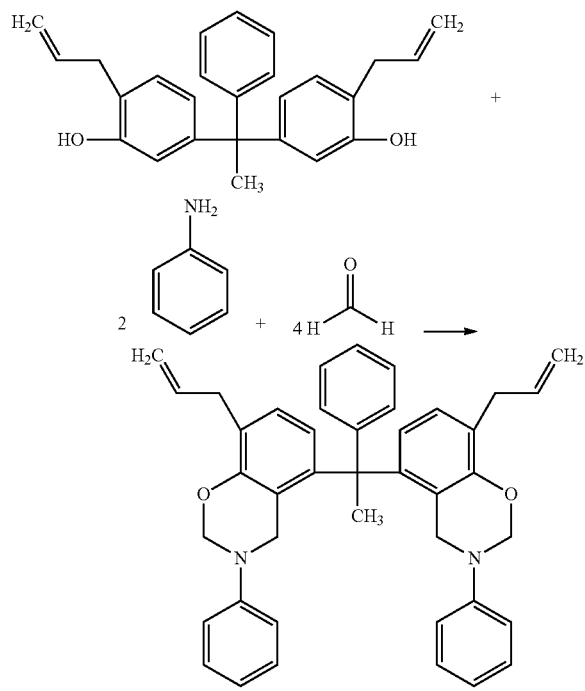

SYNTHESIS EXAMPLE 1-2

402 g of 4,4'-cyclohexylidenebisphenol (bisphenol-Z), 228 g of chloropropene and 300 g of propylene glycol monomethyl ether were added to a 3 L separable four-necked reaction flask to obtain a solution; the solution was warmed up to about 70° C. and stirred evenly while 160 g of sodium hydroxide solution (containing 50 wt. % sodium hydroxide) was added dropwise thereto within 120 min; and the solution was maintained at 70° C. and subjected to reaction for 30 min. After the reaction was completed, the solution was heated and subjected to reduced pressure (heated up to 120° C. and reduced pressure to 600 mmHg) to recover propylene glycol monomethyl ether. After the pressure was removed, 1500 g of methylbenzene was added and stirred evenly, then 600 g of water was added and stirred evenly to wash out NaCl and un-reacted reactants. After the solution was subjected to standing and layered, aqueous phase was removed, and the obtained product was washed with water for 3 times, then heated to recover methylbenzene, thus obtaining about 520 g of the following reactant. The reaction formula is as follows.

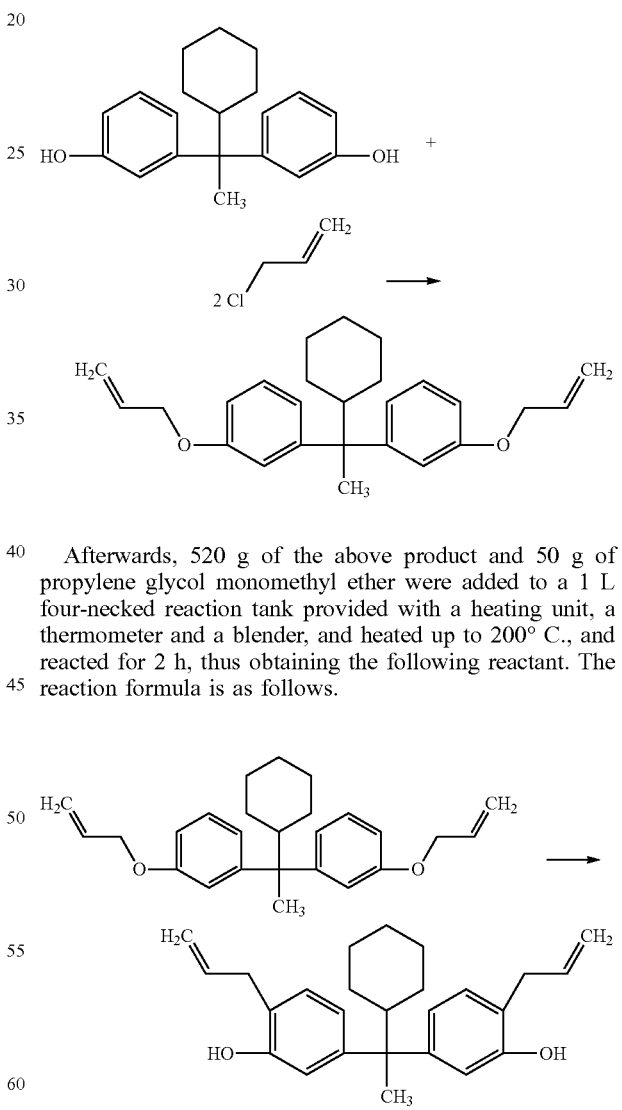

Afterwards, 520 g of the above product and 50 g of propylene glycol monomethyl ether were added to a 1 L four-necked reaction tank provided with a heating unit, a thermometer and a blender, and heated up to 200° C., and reacted for 2 h, thus obtaining the following reactant. The reaction formula is as follows.

348 g of the above product (o-diallyl bisphenol-Z), 186 g of aniline and 400 g of methylbenzene were then added to a 3 L separable four-necked reaction flask to obtain a solution; the solution was warmed up to about 40° C. and stirred evenly. 273 g of formaldehyde solution (containing 44 wt. % formaldehyde) was added dropwise to the solution within 20 min during the stirring process; the solution was heated and maintained at 85° C.-90° C. and reacted for 3 h; at the end of the reaction, heating was stopped, then the solution was subjected to standing for 20 min; after the solution was divided into two layers, the upper layer of aqueous phase and emulsion traces were removed. The solution was heated and subjected to reduced pressure (heated up to 90° C. and reduced pressure to 90 mmHg) to recover the solvent to obtain 580 g of nitrogen-oxygen heterocyclic compound. The reaction formula is as follows.

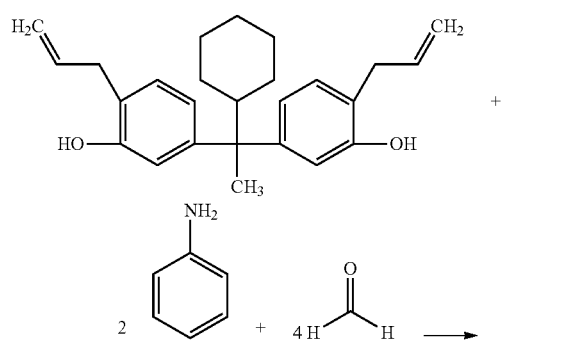

SYNTHESIS EXAMPLE 1-3

423 g of 4-[1-(4-hydroxyphenyl)-3-methylcyclohexyl] phenol (bisphenol P-MZ), 228 g of chloropropene and 300 g of propylene glycol monomethyl ether were added to a 3 L separable four-necked reaction flask to obtain a solution; the solution was warmed up to about 70° C. and stirred evenly while 160 g of sodium hydroxide solution (containing 50 wt. % sodium hydroxide) was added dropwise thereto within 120 min; and the solution was maintained at 70° C. and subjected to reaction for 30 min. After the reaction was completed, the solution was heated and subjected to reduced pressure (heated up to 120° C. and reduced pressure to 600 mmHg) to recover propylene glycol monomethyl ether. After the pressure was removed, 1500 g of methylbenzene was added and stirred evenly, then 600 g of water was added and stirred evenly to wash out NaCl and un-reacted reactants. After the solution was subjected to standing and layered, aqueous phase was removed, and the obtained product was washed with water for 3 times, then heated to recover methylbenzene, thus obtaining about 545 g of the following reactant. The reaction formula is as follows.

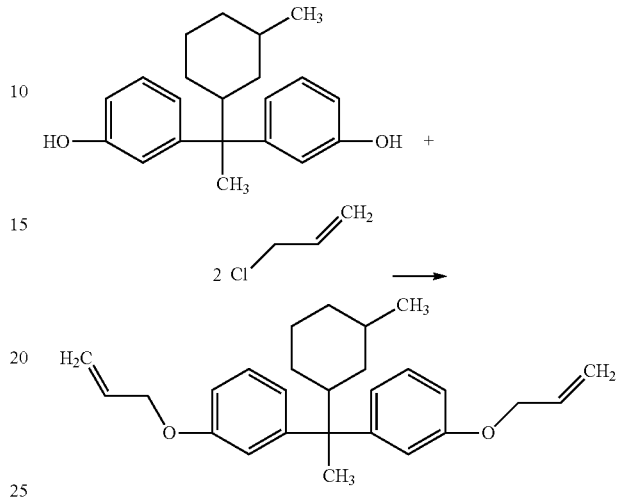

Next, 545 g of the above product and 50 g of propylene glycol monomethyl ether were added to a 1 L four-necked reaction tank provided with a heating unit, a thermometer and a blender, and heated up to 200° C., and reacted for 2 h, thus obtaining the following reactant. The reaction formula is as follows.

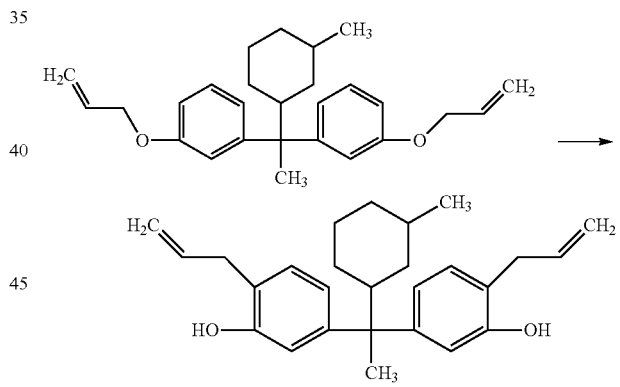

362 g of the above product (o-diallyl bisphenol P-3MZ), 186 g of aniline and 400 g of methylbenzene were then added to a 3 L separable four-necked reaction flask to obtain a solution; the solution was warmed up to about 40° C. and stirred evenly. 273 g of formaldehyde solution (containing 44 wt. % formaldehyde) was added dropwise to the solution within 20 min during the stirring process; the solution was heated and maintained at 85° C.-90° C. and reacted for 3 h; at the end of the reaction, heating was stopped, then the solution was subjected to standing for 20 min; after the solution was divided into two layers, the upper layer of aqueous phase and emulsion traces were removed. The solution was heated and subjected to reduced pressure (heated up to 90° C. and reduced pressure to 90 mmHg) to recover the solvent to obtain 590 g of nitrogen-oxygen heterocyclic compound. The reaction formula is as follows.

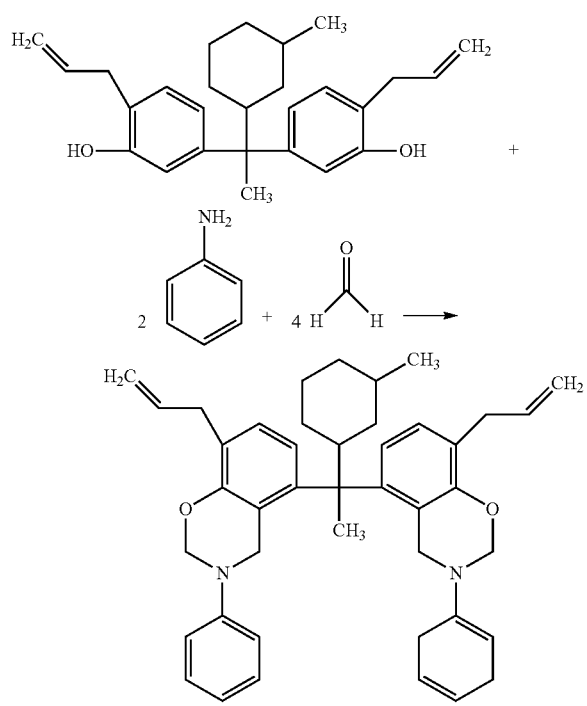

SYNTHESIS EXAMPLE 1-4

465 g of 4,4'-(3,3,5-trimethylcyclohexylidene)bisphenol (bisphenol P-HTG), 228 g of chloropropene and 300 g of propylene glycol monomethyl ether were added to a 3 L separable four-necked reaction flask to obtain a solution; the solution was warmed up to about 70° C. and stirred evenly while 160 g of sodium hydroxide solution (containing 50 wt. % sodium hydroxide) was added dropwise thereto within 120 min; and the solution was maintained at 70° C. and subjected to reaction for 30 min. After the reaction was completed, the solution was heated and subjected to reduced pressure (heated up to 120° C. and reduced pressure to 600 mmHg) to recover propylene glycol monomethyl ether. After the pressure was removed, 1500 g of methylbenzene was added and stirred evenly, then 600 g of water was added and stirred evenly to wash out NaCl and un-reacted reactants. After the solution was subjected to standing and layered, aqueous phase was removed, and the obtained product was washed with water for 3 times, then heated to recover methylbenzene, thus obtaining about 585 g of the following reactant. The reaction formula is as follows.

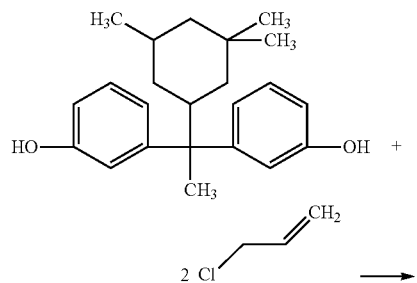

Next, 585 g of the above product and 50 g of propylene glycol monomethyl ether were added to a 1 L four-necked reaction tank provided with a heating unit, a thermometer and a blender, and heated up to 200° C., and reacted for 2 h, thus obtaining the following reactant. The reaction formula is as follows.

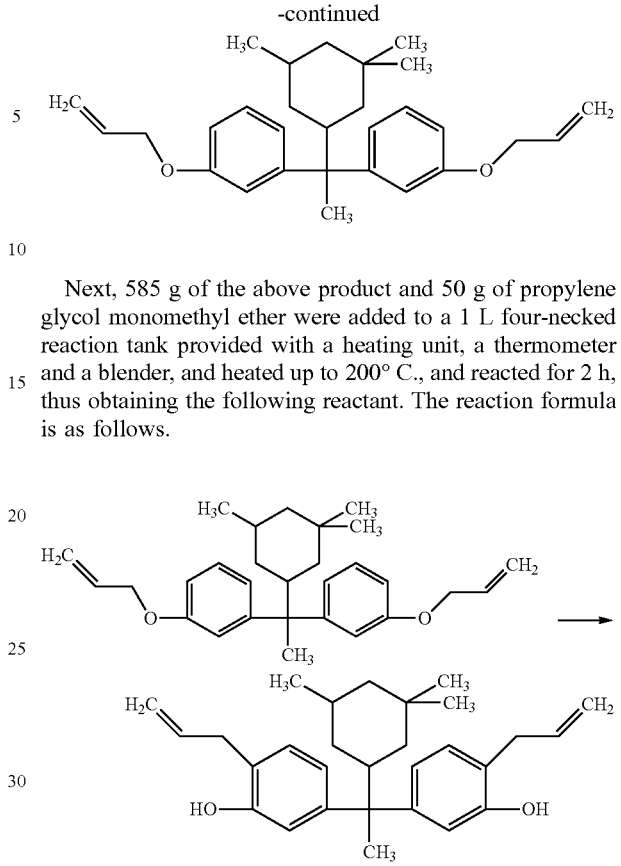

390 g of the above product (o-diallyl bisphenol P-HTG), 186 g of aniline and 400 g of methylbenzene were then added to a 3 L separable four-necked reaction flask to obtain a solution; the solution was warmed up to about 40° C. and stirred evenly. 273 g of formaldehyde solution (containing 44 wt. % formaldehyde) was added dropwise to the solution within 20 min during the stirring process; the solution was heated and maintained at 85° C.-90° C. and reacted for 3 h; at the end of the reaction, heating was stopped, then the solution was subjected to standing for 20 min; after the solution was divided into two layers, the upper layer of aqueous phase and emulsion traces were removed. The solution was heated and subjected to reduced pressure (heated up to 90° C. and reduced pressure to 90 mmHg) to recover the solvent to obtain 620 g of nitrogen-oxygen heterocyclic compound. The reaction formula is as follows.

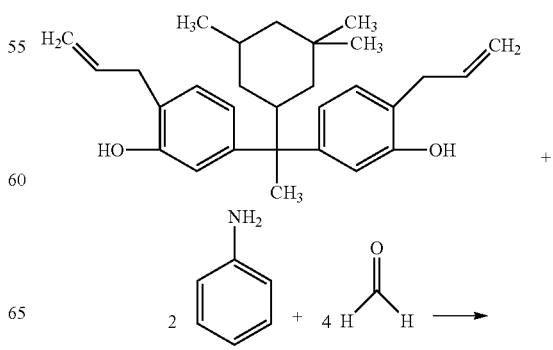

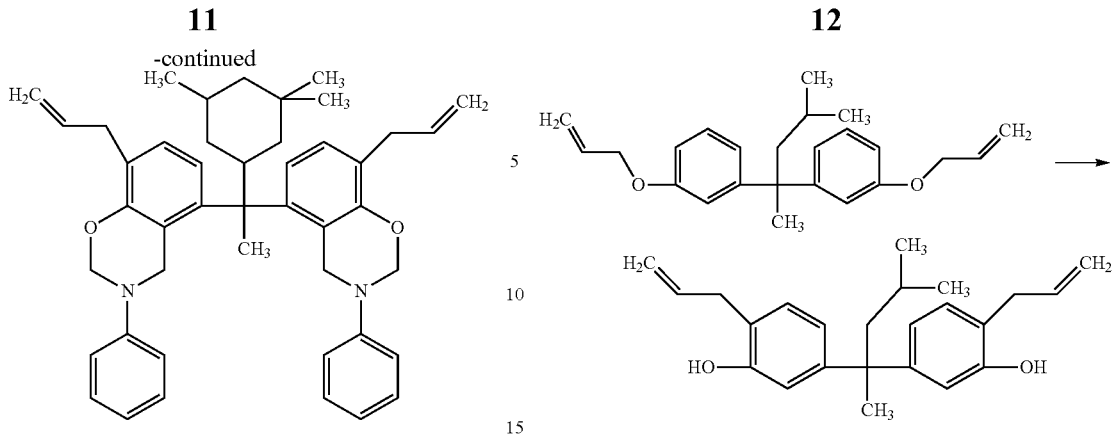

SYNTHESIS EXAMPLE 1-5

405 g of 4,4'-(1,3-dimethylbutylidene)bisphenol (bisP-MIBK), 228 g of chloropropene and 300 g of propylene glycol monomethyl ether were added to a 3 L separable four-necked reaction flask to obtain a solution; the solution was warmed up to about 70° C. and stirred evenly while 160 g of sodium hydroxide solution (containing 50 wt. % sodium hydroxide) was added dropwise thereto within 120 min; and the solution was maintained at 70° C. and subjected to reaction for 30 min. After the reaction was completed, the solution was heated and subjected to reduced pressure (heated up to 120° C. and reduced pressure to 600 mmHg) to recover propylene glycol monomethyl ether. After the pressure was removed, 1500 g of methylbenzene was added and stirred evenly, then 600 g of water was added and stirred evenly to wash out NaCl and un-reacted reactants. After the solution was subjected to standing and layered, aqueous phase was removed, and the obtained product was washed with water for 3 times, then heated to recover methylbenzene, thus obtaining about 520 g of the following reactant. The reaction formula is as follows.

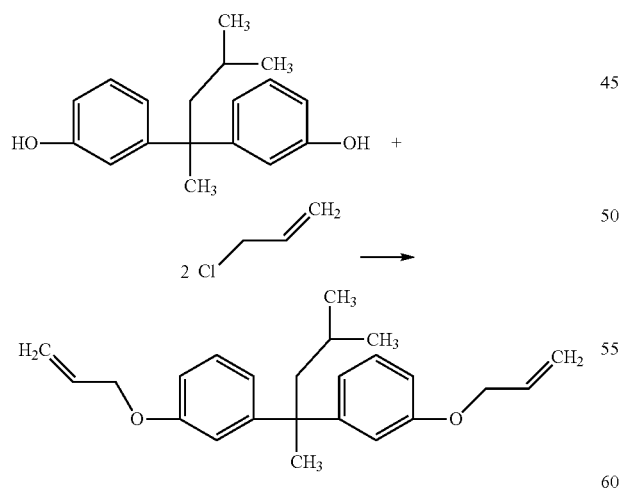

Next, 500 g of the above product and 50 g of propylene glycol monomethyl ether were added to a 1 L four-necked reaction tank provided with a heating unit, a thermometer and a blender, and heated up to 200° C., and reacted for 2 h, thus obtaining the following reactant. The reaction formula is as follows.

348 g of the above product (o-diallyl bisphenol P-HTG), 186 g of aniline and 400 g of methylbenzene were then added to a 3 L separable four-necked reaction flask to obtain a solution; the solution was warmed up to about 40° C. and stirred evenly. 273 g of formaldehyde solution (containing 44 wt. % formaldehyde) was added dropwise to the solution within 20 min during the stirring process; the solution was heated and maintained at 85° C.-90° C. and reacted for 3 h; at the end of the reaction, heating was stopped, then the solution was subjected to standing for 20 min; after the solution was divided into two layers, the upper layer of aqueous phase and emulsion traces were removed. The solution was heated and subjected to reduced pressure (heated up to 90° C. and reduced pressure to 90 mmHg) to recover the solvent to obtain 674 g of nitrogen-oxygen heterocyclic compound. The reaction formula is as follows.

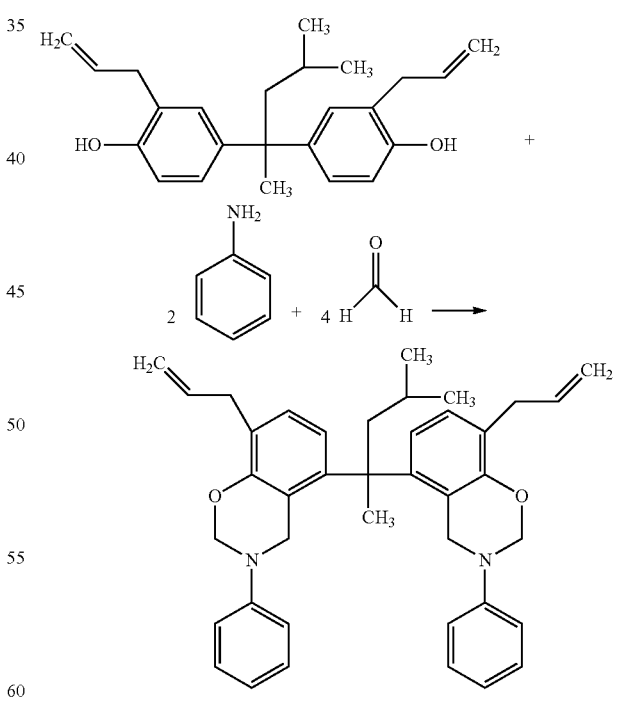

SYNTHESIS EXAMPLE 1-6

435 g of 4,4'-(1-phenylethylidene)bisphenol (BisP-AP), 228 g of chloropropene and 300 g of propylene glycol monomethyl ether were added to a 3 L separable four-necked reaction flask to obtain a solution; the solution was warmed up to about 70° C. and stirred evenly while 160 g of sodium hydroxide solution (containing 50 wt. % sodium hydroxide) was added dropwise thereto within 120 min; and the solution was maintained at 70° C. and subjected to reaction for 30 min. After the reaction was completed, the solution was heated and subjected to reduced pressure (heated up to 120° C. and reduced pressure to 600 mmHg) to recover propylene glycol monomethyl ether. After the pressure was removed, 1500 g of methylbenzene was added and stirred evenly, then 600 g of water was added and stirred evenly to wash out NaCl and un-reacted reactants. After the solution was subjected to standing and layered, aqueous phase was removed, and the obtained product was washed with water for 3 times, then heated to recover methylbenzene, thus obtaining about 550 g of the following reactant. The reaction formula is as follows.

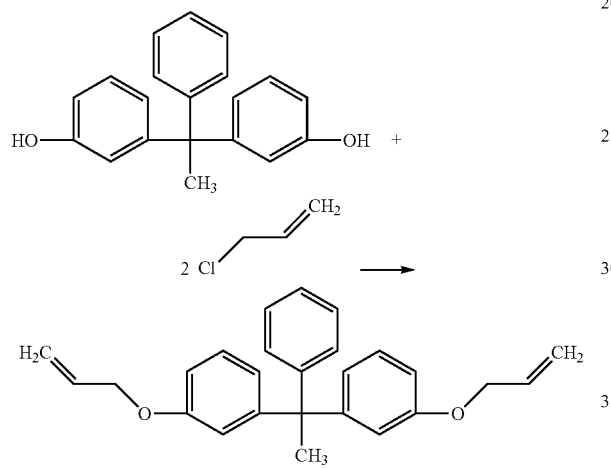

Next, 550 g of the above product and 50 g of propylene glycol monomethyl ether were added to a 1 L four-necked reaction tank provided with a heating unit, a thermometer and a blender, and heated up to 200° C., and reacted for 2 h, thus obtaining the following reactant. The reaction formula is as follows.

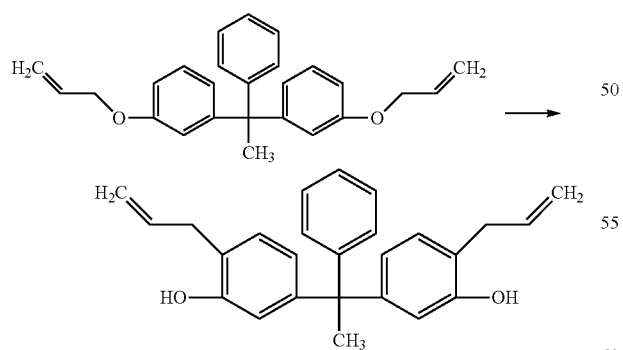

370 g of the above product (o-diallyl bisphenol-AP), 298 g of 4-butylaniline and 400 g of methylbenzene were added to a 3 L separable four-necked reaction flask to obtain a solution; the solution was warmed up to about 40° C. and stirred evenly. 273 g of formaldehyde solution (containing 44 wt. % formaldehyde) was added dropwise to the solution within 20 min during the stirring process; the solution was heated and maintained at 85° C.-90° C. and reacted for 3 h; at the end of the reaction, heating was stopped, then the solution was subjected to standing for 20 min; after the solution was divided into two layers, the upper layer of aqueous phase and emulsion traces were removed. The solution was heated and subjected to reduced pressure (heated up to 90° C. and reduced pressure to 90 mmHg) to recover the solvent to obtain 600 g of nitrogen-oxygen heterocyclic compound. The reaction formula is as follows.

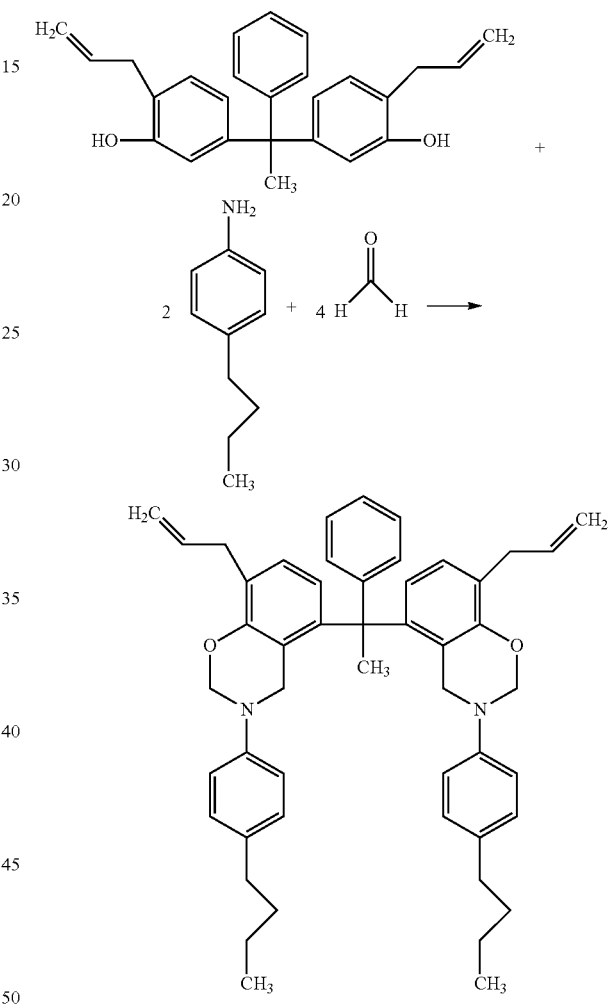

SYNTHESIS EXAMPLE 1-7

435 g of 4,4'-(1-phenylethylidene)bisphenol (BisP-AP), 228 g of chloropropene and 300 g of propylene glycol monomethyl ether were added to a 3 L separable four-necked reaction flask to obtain a solution; the solution was warmed up to about 70° C. and stirred evenly while 160 g of sodium hydroxide solution (containing 50 wt. % sodium hydroxide) was added dropwise thereto within 120 min; and the solution was maintained at 70° C. and subjected to reaction for 30 min. After the reaction was completed, the solution was heated and subjected to reduced pressure (heated up to 120° C. and reduced pressure to 600 mmHg) to recover propylene glycol monomethyl ether. After the pressure was removed, 1500 g of methylbenzene was added and stirred evenly, then 600 g of water was added and stirred evenly to wash out NaCl and un-reacted reactants. After the solution was subjected to standing and layered, aqueous phase was removed, and the obtained product was washed with water for 3 times, then heated to recover methylbenzene, thus obtaining about 550 g of the following reactant. The reaction formula is as follows.

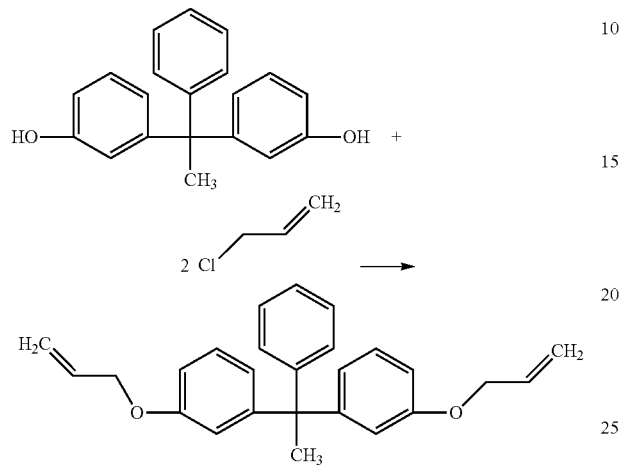

Next, 550 g of the above product and 50 g of propylene glycol monomethyl ether were added to a 1 L four-necked reaction tank provided with a heating unit, a thermometer and a blender, and heated up to 200° C., and reacted for 2 h, thus obtaining the following reactant. The reaction formula is as follows.

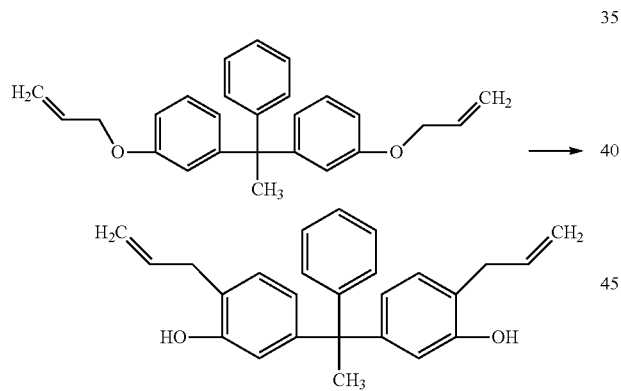

370 g of the above product (o-diallyl bisphenol-AP), 98 g of aniline and 149 g of 4-butylaniline, and 400 g of methylbenzene were added to a 3 L separable four-necked reaction flask to obtain a solution; the solution was warmed up to about 40° C. and stirred evenly. 273 g of formaldehyde solution (containing 44 wt. % formaldehyde) was added dropwise to the solution within 20 min during the stirring process; the solution was heated and maintained at 85° C.-90° C. and reacted for 3 h; at the end of the reaction, heating was stopped, then the solution was subjected to standing for 20 min; after the solution was divided into two layers, the upper layer of aqueous phase and emulsion traces were removed. The solution was heated and subjected to reduced pressure (heated up to 90° C. and reduced pressure to 90 mmHg) to recover the solvent to obtain 600 g of nitrogen-oxygen heterocyclic compound. The reaction formula is as follows.

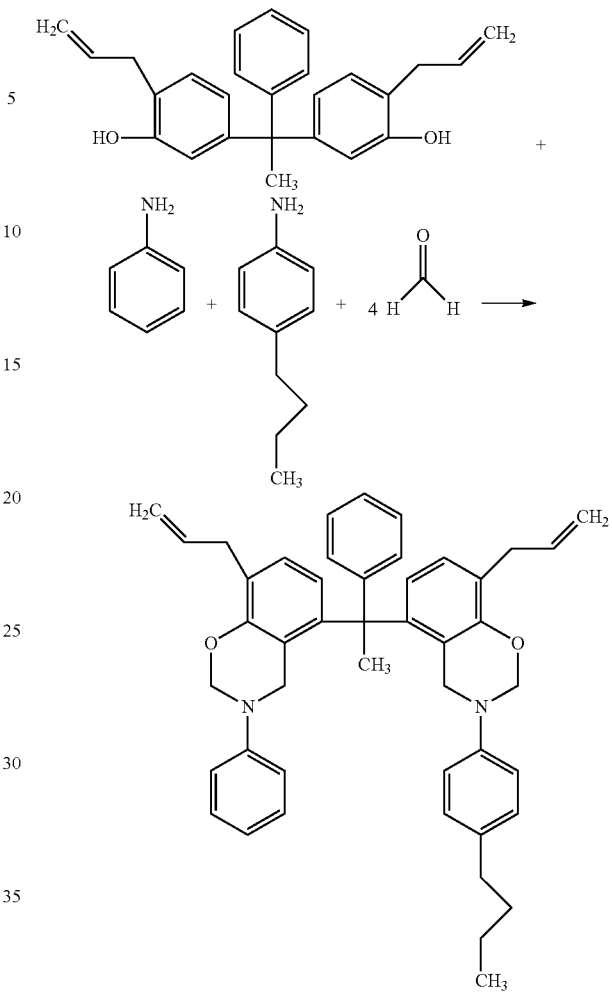

Synthesis Examples 1-1 to 1-7 were respectively corresponding to BZ-1 to BZ-7 in Table 1. Number in Table 1 is a molar ratio of the monomer in each synthesis example.

In application, the resin of Formula 1-1 may be mixed with other materials. In one example, the resin of Formula 1-1 may be mixed with a filler, a thermosetting resin, a reinforcement material and a toughening agent, then dissolved or dispersed into a solvent to prepare into a paint-like form. The solvent may be any inert solvent capable of dissolving or dispersing the above each component, but not reacting with the component, including but not limited to methylbenzene, γ-butyrolactone, methyl ethyl ketone, cyclohexanone, butanone, acetone, xylene, methyl isobutyl ketone, N,N-dimethyl formamide (DMF), N,N-dimethyl acetamide (DMAc), N-methyl-pyrolidone (NMP), or a combination thereof.

In another aspect, the present invention further discloses a resin composition and a copper clad laminate made from the resin composition. The resin composition includes 25-50 wt. % a benzoxazine resin (as shown in Formula 1-1), 35-60 wt. % of a filler, 6-15 wt. % of a thermosetting resin and 8-15 wt. % of a toughening agent. According to different application requirements, the resin composition may further include other additives, for example, a cross-linking agent, an accelerant and the like.

To describe the technical solution of the present invention specifically, a metal clad laminate plate for the printed circuit board made from benzoxazine according to Formula 1-1 of the present invention is set as an example. Compared with other Comparative Examples, the benzoxazine resin used in the Comparative Example has a chemical formula of the following Formula. Table 2 shows formulations of different examples; the unit is a weight ratio. n1 and n2 range from 2 to 5, respectively, and may be an integer or a non-integer.

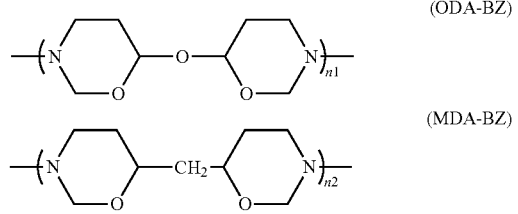

(ODA-BZ)
(MDA-BZ)

Benzoxazine of Formula 1-1, a filler, a thermosetting resin and a toughening agent were mixed in a solvent. The filler was silicon dioxide ($SiO_2$) having a grain size of 10 μm; the thermosetting resin was a bismaleimide resin (BMI) with a model of KI-70 purchased from Daiwa Chemical Industries Co., LTD. The toughening agent was a butadiene-styrene copolymer with a model of Ricon® 100; the solvent was a mixture of methylbenzene, methyl ethyl ketone and γ-butyrolactone to obtain a clear lacquer; a base material (or called a reinforced material) was impregnated into the clear lacquer by a roll coater, and then dried at 175° C., thus obtaining semisolid preimpregnated sheets. In this example, the base material was a glass fiber cloth with a model of 2116 and a thickness of 0.08 mm; the clear lacquer content in the preimpregnated sheet was 54 wt. %.

The four preimpregnated sheets were piled up, and then a piece of 0.5 oz copper clad was respectively disposed at the top and bottom of the preimpregnated sheets. Next, the obtained sheets were placed into a hot press for hot-pressing solidification at high temperature, and heated up to 200° C.-220° C. at a heating rate of 3.0° C./min, then hot-pressed for 180 min at a pressure of 15 kg/cm² and at the temperature, and cooled to room temperature, thus preparing a double-sided copper clad laminate plate.

The glass transition temperature (Tg), Z-axis coefficient of thermal expansion (Z-CTE), tear resistance and heat resistance test of the double-sided copper clad laminate plate obtained in the above process were measured. The results are shown in Table 3.

Tg was measured by a dynamic thermomechanical analyzer (DMA) in accordance with the method of the IPC-TM-650 2.4.24.4 regulation. Z-CTE was measured by a thermal mechanical analyzer (TMA) in accordance with the method of the IPC-TM-650 2.4.24.5 regulation. The change rate of coefficient of thermal expansion in the Z-axis direction was measured lower than the $T_g$ temperature (within 50° C.-260° C.). The tear resistance refers to the strength of force by which a copper clad having a width of ⅛ inches can be torn from the board vertically. The heat resistance test referred as follows: the dried double-sided copper clad laminate plate was soaked into a 300° C. tin soldering bath, and then heat proof time was tested.

As can be seen from the results of Table 3, the double-sided copper clad laminate plate prepared by the benzoxazine resin of the present invention has excellent bonding strength to copper clad and low coefficient of thermal expansion, and has high heat resistance and high glass transition temperature.

TABLE 1

| | Material | BZ-1 | BZ-2 | BZ-3 | BZ-4 | BZ-5 | BZ-6 | BZ-7 |
|---|---|---|---|---|---|---|---|---|
| Bisphenol | 4,4'-(1-Phenylethylidene)bisphenol | 1 | — | — | — | — | 1 | 1 |
| | 4,4'-Cyclohexylidenebisphenol | — | 1 | — | — | — | — | — |
| | 4-[1-(4-Hydroxyphenyl)-3-methylcyclohexyl]phenol | — | — | 1 | — | — | — | — |
| | 4,4'-(3,3,5-Trimethylcyclohexylidene) bisphenol | — | — | — | 1 | — | — | — |
| | 4,4'-(1,3-Dimethylbutylidene)bisphenol | — | — | — | — | 1 | — | — |
| Monoamine | Aniline | 2 | 2 | 2 | 2 | 2 | — | 1 |
| | 4-Butylaniline | — | — | — | — | — | 2 | 1 |
| Aldehyde | Formaldehyde | 4 | 4 | 4 | 4 | 4 | 4 | 4 |

TABLE 2

| Material | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|
| BZ-1 | 31.5 | — | — | — | — | — | — | — | — | — |
| BZ-2 | — | 31.5 | — | — | — | — | — | — | — | — |
| BZ-3 | — | — | 31.5 | — | — | — | — | — | — | — |
| BZ-4 | — | — | — | 31.5 | — | — | — | — | — | — |
| BZ-5 | — | — | — | — | 31.5 | — | — | — | — | — |
| BZ-6 | — | — | — | — | — | 31.5 | — | — | — | — |
| BZ-7 | — | — | — | — | — | — | 31.5 | — | — | — |
| ODA-BZ | — | — | — | — | — | — | — | 31.5 | — | 28.5 |
| MDA-BZ | — | — | — | — | — | — | — | — | 31.5 | — |
| Filler | 41 | 41 | 41 | 41 | 41 | 41 | 41 | 41 | 41 | 39 |
| Thermosetting resin | 12 | 12 | 12 | 12 | 12 | 12 | 12 | 12 | 12 | 12 |
| Toughening agent | 10 | 10 | 10 | 10 | 10 | 10 | 10 | 10 | 10 | 15 |
| Cross-linking agent | 5 | 5 | 5 | 5 | 5 | 5 | 5 | 5 | 5 | 5 |
| Accelerant | 0.5 | 0.5 | 0.5 | 0.5 | 0.5 | 0.5 | 0.5 | 0.5 | 0.5 | 0.5 |

TABLE 3

| Property | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|
| $T_g$ (° C.) | 183 | 189 | 196 | 195 | 192 | 190 | 188 | 178 | 176 | 182 |
| Z-CTE (%) | 4.4% | 4.3% | 4.1% | 4.4% | 4.2% | 4.1% | 4.2% | 4.5% | 4.5% | 4.9% |
| Tear resistance (lb/ft) | 6.8 | 6.6 | 6.9 | 6.6 | 6.9 | 7.0 | 6.9 | 6.3 | 6.1 | 6.2 |
| Heat resistance test | >100 sec | >100 sec | >100 sec | >100 sec | >100 sec | >100 sec | >100 sec | 57 sec | 72 sec | 62 sec |

What is claimed is:

1. A benzoxazine resin, comprising a compound of the following Formula 1-1:

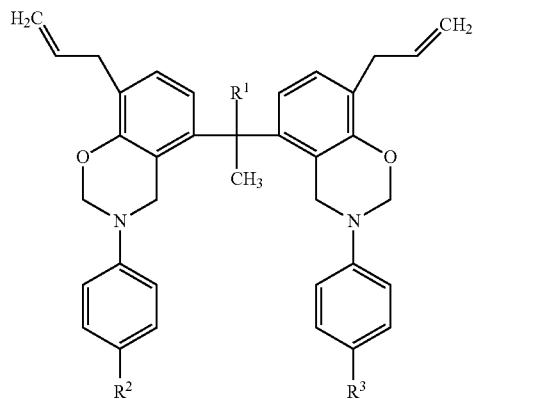

(Formula 1-1)

wherein $R^1$ is selected from a group consisting of:

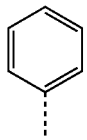

(Formula 1-2)

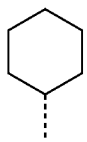

(Formula 1-3)

-continued

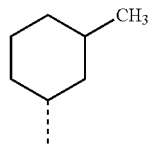

(Formula 1-4)

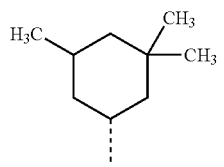

(Formula 1-5)

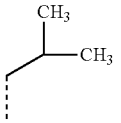

(Formula 1-6)

wherein the dashed line represents bonding; and $R^2$ and $R^3$ are the same or different, and are each independently selected from a group consisting of H, an ether group, carbonyl, substituted or unsubstituted C1-C10 alkyl, substituted or unsubstituted C1-C10 cycloalkyl and substituted or unsubstituted C6-C20 aryl.

2. A resin composition, comprising 25-50 wt. % of the benzoxazine resin of claim 1, 35-60 wt. % of a filler, 6-15 wt. % of a thermosetting resin and 8-15 wt. % of a toughening agent.

3. A copper clad laminate, made of the resin composition of claim 2.

* * * * *